United States Patent

Wade et al.

Patent Number: 6,034,411
Date of Patent: Mar. 7, 2000

[54] INVERTED THIN FILM RESISTOR

[75] Inventors: William R. Wade, Palm Bay; Jack Linn, Melbourne, both of Fla.

[73] Assignee: Intersil Corporation, Palm Bay, Fla.

[21] Appl. No.: 08/960,337

[22] Filed: Oct. 29, 1997

[51] Int. Cl.$^7$ .................................................. H01L 29/00
[52] U.S. Cl. ........................... 257/536; 257/537; 338/307; 338/314
[58] Field of Search ..................... 257/536, 752, 257/379, 537, 538; 338/225 D, 307, 312, 314

[56] References Cited

U.S. PATENT DOCUMENTS

| | | |
|---|---|---|
| 4,016,525 | 4/1977 | Maher et al. . |
| 4,031,272 | 6/1977 | Khanna . |
| 4,104,421 | 8/1978 | Maher et al. . |
| 4,684,916 | 8/1987 | Ozawa . |
| 4,725,810 | 2/1988 | Foroni et al. . |
| 4,868,537 | 9/1989 | Blanchard . |
| 5,216,404 | 6/1993 | Nagai et al. . |
| 5,274,352 | 12/1993 | Nishikawa et al. . |
| 5,367,284 | 11/1994 | Morris . |
| 5,414,404 | 5/1995 | Jeong et al. . |
| 5,485,138 | 1/1996 | Morris . |
| 5,510,594 | 4/1996 | Mori et al. . |
| 5,510,652 | 4/1996 | Burke et al. .............................. 257/752 |
| 5,623,164 | 4/1997 | Auer et al. .............................. 257/752 |

*Primary Examiner*—Mahshid Saadat
*Assistant Examiner*—George C. Eckert, II
*Attorney, Agent, or Firm*—Rogers & Killeen

[57] ABSTRACT

An integrated circuit inverted thin film resistor structure and method of manufacture having interconnect defining resistor contacts and leads resident within and coplanar with a supporting layer, resistive material uniformly overlaying the supporting layer and contacts, the resistive material diffused into the resistor/interconnect contact region.

8 Claims, 1 Drawing Sheet

INVERTED THIN FILM RESISTOR

BACKGROUND OF THE INVENTION

This invention generally relates to integrated circuit resistors and methods for their manufacture. More particularly, this invention relates to an improved inverted thin film resistor structure and its method of manufacture.

In the prior art, integrated circuit resistors were manufactured by placing metallic current carrying interconnect material, e.g., aluminum, atop a resistor structure, e.g., comprising a NiCr material, and subjecting the resistor/interconnect materials to a stabilization bake. The stabilization bake stabilizes the resistor/interconnect junction by intermixing the resistor/interconnect materials. Ideally, during stabilization bake, the nickel from the resistor material diffuses into the aluminum and forms a strong electrical connection.

However, due to contaminants present on the resistor structure surface when the interconnect material is thereupon placed, the stabilization bake may result in an imperfect electrical connection at the junction formed between the resistor structure and the interconnection material. Contaminants may include an oxide layer formed on the resistor structure prior to placement of the interconnect material, e.g., from available oxide from surrounding passivation layers. Further, residual foreign material may be present on the surface of the resistor structure, e.g., from photoresist and subsequent photoresist stripping. The presence of oxide and foreign material on the surface of the resistor structure disrupts the intended intermixing of, e.g., aluminum and NiCr at the junction. This may result in an open at the junction, and hence an open resistor, or may result in poor electrical connection which reduces the current carrying capacity of the resistor.

One approach to overcoming resistor structure surface contamination caused by oxide formation is disclosed in U.S. Pat. No. 5,414,404 to Jeong, et al., FIG. 1. An insulating layer is formed on a substrate containing an interconnect contact, with the insulating layer then removed from above the interconnect region. Thereupon a metal layer and an interlayer are formed. An opening is provided within the metal layer and interlayer, into which the resistor material is placed. After the resistor structure manufacture is complete, the device undergoes heat treatment to form good electrical connection between the metal layer and the interlayer, and between the interlayer and the resistor layer. Disadvantageously, this is not a simple manufacturing process.

U.S. Pat. No. 5,485,138 to Morris discloses an inverted thin film resistor and a method for its manufacture, FIG. 2. Morris discloses providing a first dielectric layer formed on the surface of a substrate, upon which a metallic interconnect layer is deposited. The metallic interconnect layer is then patterned and etched, as desired to form the desired interconnect leads. An interlevel dielectric is first deposited over the formed interconnect leads, and then planarized so as to bring the interlevel dielectric layer below the level of the interconnect leads, i.e., exposing a precise amount of the interconnect leads above the surface of the interlevel layer. A resistor layer is then applied over the interconnect leads onto the interlevel dielectric layer.

Disadvantageously, the planarization of the interlevel dielectric so as to assure that no interconnect leads are left uncleared requires overetching to expose at least a portion of the interconnect lead above the dielectic surface. Due to manufacturing limitations, this planarization may occur unevenly and requires precise, complex process control as controlling the amount of planarization to expose precise amounts of interconnect can be difficult for various reasons, e.g., the underlying topography can cause different metal bars to be at different heights with varying thickness of dielectric covering any given metal bar; closely spaced metal bars where resistors are often located can be difficult to planarize; and photoresist thickness may also vary across the wafer as a function of dielectric thickness/metal height.

Overetching the dielectric so that the interconnect leads extend a height greater than the interlevel dielectric presents a non-planer surface for application of the resistor material, opening all metal tops for application of the resistor material. The resistor material must be carefully applied so as to fully contact the step area where the interconnect rises above the interlevel dielectric layer. As can be seen in FIG. 2, the resistor structure is thinned out over the interconnect steps and is not of a uniform thickness overall. Such an arrangement may lead to opens at the interconnect/resistor junctions or to unstable devices. During the dielectric planarization etch, the surface of the dielectric is roughened which can result in increased surface area and metal bar height variation with increased resistor thickness variation, especially with very thin film resistors, e.g., less than 15 nanometers. The metal bars extruding from the dielectric may also result in poor resistor step coverage at the metal-to-resistor step when extremely thin films such as NiCr and SiCr are used. This may be particularly problematic where these films are often less than 8 to 12 nanometers. Thinning of the resistor structure over the contacting interconnect steps reduces the current carrying capacity of the resistor and destabilizes the resistor.

The present invention obviates some of the problems of the prior art by providing a simpler manufacturing process in which resistor material directly contacts interconnect material coplanar with a device substrate, enhancing the functional area of thin film resistors in the bulk of the resistor and at the interface between the thin film resistor material and the interconnect material. The present invention, by decreasing contamination and improving resistor-to-metal step coverage, especially with extremely thin resistor material, provides improved resistor stability. Resistor width and lengths are made more predictable due to the present invention utilizing a coplanar surface as well as obviating the requirement for a roughened dielectric surface.

Accordingly, it is an object of the present invention to provide a novel inverted resistor having a resistor film contacting a device substrate with embedded interconnect leads in the plane of the substrate.

It is another object of the present invention to provide a novel inverted resistor structure of uniform thickness in conjunction with trench resident metallic contacts.

It is yet another object of the present invention to provide a novel integrated circuit resistor structure having increased functional area and increased current carrying junctions by planarizing a support layer containing embedded resistor contacts to enhance electrical connection with an overlaying resistor structure.

It is still another object of the present invention to provide a novel method of enhancing stabilization bake intermixing between adjacent interconnect material and resistor material by overlaying resistor material upon interconnect leads resident in a planarized substrate.

It is a further object of the present invention to provide a novel method of enhancing connection between a planarized interconnect lead and contacting resistor material.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
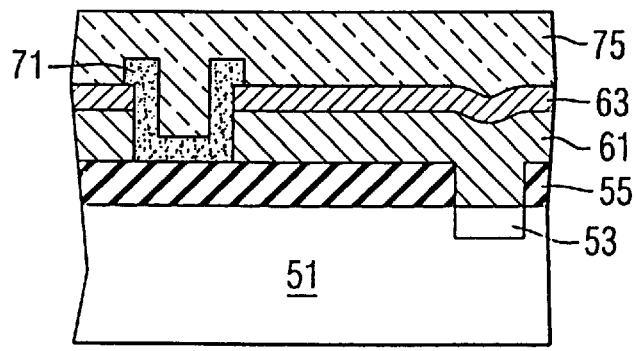
FIG. 1 is a cross sectional view of a first type prior art thin film resistor.
Figure 2:
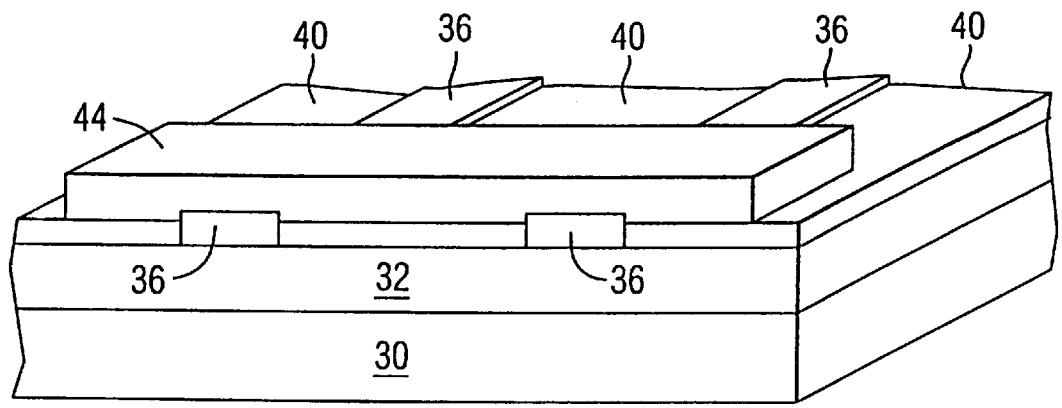
FIG. 2 is a perspective view of a second type prior art thin film resistor.
Figure 3:
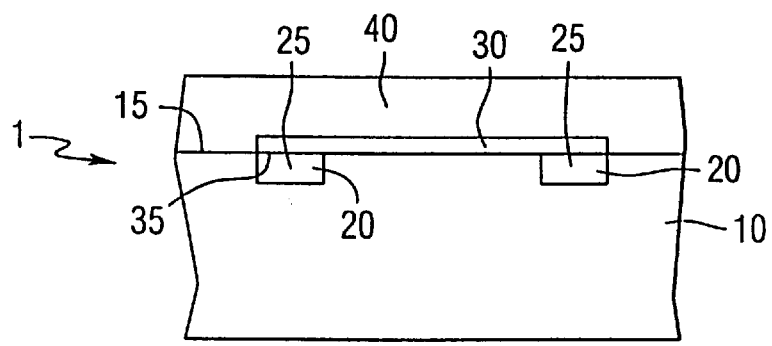
FIG. 3 is a cross sectional view of an embodiment of an inverted thin film resistor of the present invention.

With reference to FIG. 3, one embodiment of the present invention disclosing an inverted thin film resistor package 1 can be understood. Substrate dielectric layer 10 is of conventional materials and conventionally formed, the material and thickness selected to be suitable for the final intended device package. Depending on the particular application, other device components may exist below dielectric layer 10. Advantageously, the method of the present invention may be utilized independent of topography underlying dielectric layer 10.

After forming dielectric layer 10, e.g., by deposition, upper surface 15 is completely planarized. Due to the absence of components at upper surface 15, the planarization may be accomplished without the use of complex equipment and without the requirement for precise depth control of individual regions.

Trenching dielectric layer 10 through planarized upper surface 15 defines a resistor contact path (not shown in profile FIG. 3). The trenching depth and range are selected so that resistor contact trench regions 20 of a desired depth and width result and offer a location for metal interconnect to reside.

Interconnect metal is deposited into trench regions 20. Interconnect metal such as tungsten, copper, titanium-tungsten alloy, and aluminum are suitable. Interconnect metal deposited into trench regions 20 serve as resistor leads and contact regions 25. Resistor leads and contact regions 25 are made coplanar with dielectric layer 10 by metal etchback or CMP process planarization. In an alternative embodiment of the invention, resistor leads and contact regions 25 may be etched back to a level below upper surface 15.

Overlaying resistor material on contact regions 25 forms an enhanced current junction between the final resistor body and the lead and contact 25. Resistor material overlaying dielectric layer 10 forms a resistive body 30. Selectively shaping the resistive body forms the desired resistor 30. Due to the coplanar relationship between dielectric layer 10 and contacts 25, resistor width and lengths are more predictably formed. Additionally, the use of an unroughened dielectric surface 15 improves resistor depth control. Typically, resistor material is applied 10 to 30 nanometers thick. More preferably, this embodiment is suitable for very thin film resistor, e.g., less than about 15 nanometers.

Resistor materials including NiCr, CrSi, $CoSi_x$, metal suicides are suitable. In one embodiment, NiCr is used as a thin film for resistor thicknesses ranging from 8 to 12 nanometers or less. In another embodiment, SiCr is used as a thin film for resistor thicknesses ranging from 8 to 12 nanometers or less.

After the resistive material has been shaped into resistor body 30, a stabilization bake further increases the current carrying capacity of the resistor material-interconnect junction 35 by intermixing the resistor/interconnect materials through the diffusion of resistor material into the interconnect material at junction 35.

Device 1 may include further dielectric layer 40 over resistor 30. Further device components may be provided over further dielectric layer 40 as is suitable for a specific application and device.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. An integrated circuit inverted thin film resistor structure comprising:

interconnect material defining a resistor contact and lead resident within a supporting layer, the resistor contact being exposed at the supporting layer surface and having a height not exceeding the supporting layer surface;

a film of resistive material having a thickness of 10–30 nm overlaying at least a portion of the supporting layer and the contact, the thickness of the resistive film over the contact being at least as thick as the thickness of the resistive film over the supporting layer; and a junction region providing a conductive path from the resistive film to the resistor contact and lead, the junction region being defined by a region surrounding the interface between the contact and resistive film, and having an intermixture of interconnect material and resistive material.

2. The resistor structure of claim 1, wherein the resistive material forms a layer of uniform thickness over the supporting layer.

3. The resistor structure of claim 2, wherein the supporting layer is a device substrate layer.

4. The structure of claim 1, wherein said contact height is coplanar with the supporting layer surface.

5. An integrated inverted thin film resistor made by a process comprising the steps of:

(a) providing a supporting layer of an insulating material having a substantially planar upper surface;

(b) trenching through the upper surface of the supporting layer to form a trench having a predetermined shape;

(c) providing a member for conducting electricity, said member comprising a contact material and having the predetermined shape with a substantially planar top surface;

(d) positioning the member in the trench with the top surface thereof having a height not exceeding the upper surface of the supporting layer;

(e) providing a film having a thickness of 10–30 nm of a resistive material over at least a portion of the supporting layer and over at least a portion of said member, the resistive film over the member being at least as thick as the resistive film over the supporting layer; and (f) treating the junction of the member and the resistive film to provide an intermixture of resistive material and interconnect material, said junction providing a conductive path between the resistive film and the member.

6. An integrated inverted thin film resistor comprising:
- a resistor contact of a contact material and having an elongated block shape with substantially planar surfaces including a top surface;
- a supporting layer of an insulating material having:
  (i) a planarized upper surface, and
  (ii) a trench with an opening through said planarized upper surface shaped to receive said contact, said supporting layer being in a supporting relationship to said contact and the top surface of said contact not exceeding the upper surface of the said supporting layer;

- a film of a resistive material having a thickness of 10–30 nm overlaying at least a portion of said supporting layer and at least a portion of said contact, said resistive film over said contact being at least as thick as said resistive film over said supporting layer; and
- a junction region providing a conductive path between said resistive film and said contact, said junction region being defined by a region surrounding the interface between the top surface of said contact and said resistive film, said junction region having an intermixture of resistive material and interconnect material.

7. The resistor of claim 6 wherein said supporting layer is a substrate layer.

8. The resistor of claim 6 wherein the top surface of said contact is coplanar with the top surface of said supporting layer.

* * * * *